United States Patent
Yoon et al.

(10) Patent No.: US 8,194,486 B2
(45) Date of Patent: Jun. 5, 2012

(54) SEMICONDUCTOR MEMORY DEVICES HAVING BIT LINES

(75) Inventors: Hyun-chul Yoon, Incheon (KR);
Seong-jin Jang, Seongnam-si (KR);
Dong-hak Shin, Hwaseong-si (KR);
Soo-hwan Kim, Yongin-si (KR);
Hyuk-joon Kwon, Suwon-si (KR);
Jong-min Oh, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 79 days.

(21) Appl. No.: 12/591,623

(22) Filed: Nov. 25, 2009

(65) Prior Publication Data
US 2010/0128514 A1 May 27, 2010

(30) Foreign Application Priority Data
Nov. 25, 2008 (KR) .................. 10-2008-0117474

(51) Int. Cl.
G11C 7/06 (2006.01)
G11C 7/08 (2006.01)
G11C 5/06 (2006.01)
G11C 7/02 (2006.01)
G11C 11/4091 (2006.01)
G11C 11/4097 (2006.01)
G11C 11/4099 (2006.01)

(52) U.S. Cl. .......... 365/207; 365/63; 365/72; 365/149; 365/203; 365/205; 365/208; 365/210.1; 365/214

(58) Field of Classification Search .......... 365/145, 365/149, 203, 204, 205, 207, 208, 210.1, 365/63, 72, 214
See application file for complete search history.

(56) References Cited

U.S. PATENT DOCUMENTS

| | | | | |
|---|---|---|---|---|
| 4,598,389 A | * | 7/1986 | Duvvury et al. | 365/189.05 |
| 4,625,300 A | * | 11/1986 | McElroy | 365/205 |
| 5,608,668 A | * | 3/1997 | Zagar et al. | 365/149 |
| 6,301,175 B1 | * | 10/2001 | Seyyedy et al. | 365/203 |
| 7,286,425 B2 | | 10/2007 | Barth | |
| 2002/0001251 A1 | * | 1/2002 | Fujino et al. | 365/230.08 |

FOREIGN PATENT DOCUMENTS

| KR | 10-0275106 | 9/2000 |
|---|---|---|
| KR | 10-2001-0005157 | 1/2001 |
| KR | 10-2005-0023537 | 3/2005 |

* cited by examiner

*Primary Examiner* — J. H. Hur
(74) *Attorney, Agent, or Firm* — Harness, Dickey & Pierce, P.L.C.

(57) ABSTRACT

A semiconductor device includes a bit line connected to a plurality of memory cells in a memory block and a sense amplifier having a first node connected to the bit line and a second node, which is not connected to any bit line. The second node has a capacitive load less than that of the bit line. The sense amplifier amplifies a first data using a voltage difference between the first node and the second node caused by a charge sharing operation, and a second data using a capacitive mismatch between the first node and the second node.

19 Claims, 8 Drawing Sheets

SEMICONDUCTOR MEMORY DEVICES HAVING BIT LINES

CROSS-REFERENCE TO RELATED APPLICATION(S)

This application claims priority under 35 U.S.C. §119 to Korean Patent Application No. 10-2008-0117474, filed on Nov. 25, 2008, in the Korean Intellectual Property Office, the entire contents of which are incorporated herein by reference.

BACKGROUND

1. Field

Inventive concepts of example embodiments relate to semiconductor memory devices, for example, semiconductor memory devices having a bit line disposed on a memory block without a complimentary bit line, and methods of sensing and amplifying data thereof.

2. Description of the Conventional Art

Conventional semiconductor memory devices, such as dynamic random access memory (DRAM), have a plurality of memory blocks and a plurality of sense amplifiers between memory blocks. Each memory block includes a plurality of memory cells, and is connected to one of a plurality of column lines and one of a plurality of row lines.

Most conventional semiconductor memory devices have either a folded bit line structure or an open bit line structure. A sense amplifier having a folded bit line structure senses the voltage difference between two bit lines disposed on the same memory block using one of two bit lines as a complementary bit line. A sense amplifier having an open bit line structure senses the voltage difference between two bit lines disposed in different memory blocks using one of the two bit lines as a complementary bit line. In each case, however, the sense amplifier uses a complimentary bit line.

Recently, the open bit line structure has been more widely adopted because the open bit line structure integrates more memory cells in the same area. However, a semiconductor memory device using the open bit line structure must have dummy cells in edge memory blocks disposed at both sides of the memory blocks.

Also, bit lines need to be pre-charged to a constant voltage level before beginning a read operation of a sense amplifier. Conventionally, there are three ways to pre-charge bit lines; a half power supply voltage ½ VDD pre-charge scheme, a power supply voltage VDD pre-charge scheme and a ground voltage VSS pre-charge scheme. As demand for lower power semiconductor memory devices grows, the power supply voltage VDD pre-charge scheme and the ground voltage VSS pre-charge scheme have been more widely studied. The ½ VDD pre-charge scheme, however, has not.

SUMMARY

According to at least one example embodiment, a semiconductor memory device comprises: a bit line and a sense amplifier. The bit line is connected to a plurality of memory cells in a memory block. The sense amplifier includes a first node and a second node. The first node is connected to the bit line, whereas the second node is not electrically connected to any bit line. The sense amplifier has a capacitive load less than that of the bit line, and the capacitive load of the bit line is about 10 times greater than that of the second node.

According to at least some example embodiments, the semiconductor memory device further includes an isolation transistor arranged between the bit line and the first node. A word line is connected to at least one of the plurality of memory cells. In this example, the isolation transistor connects the first node to the bit line if the word line is activated.

According to at least some example embodiments, the sense amplifier is configured to sense and amplify a voltage difference caused by a charge sharing operation between the first node and the second node if one of the plurality of memory cells has first data. In addition, the sense amplifier is configured to sense and amplify the voltage difference caused by a mismatch of a capacitive load between the first node and the second node if the one of the plurality of memory cells has second data.

According to at least some example embodiments, the sense amplifier may be configured to sense and amplify a voltage difference caused by a charge sharing operation between the first node and the second node based on data of one of the plurality of memory cells. The sense amplifier may also be configured to sense and amplify a voltage difference caused by a mismatch in a capacitive load between the first node and the second node based upon data of one of the plurality of memory cells.

According to at least some example embodiments, the sense amplifier includes a first pair of transistors serially connected between the first node and the second node. The first pair of transistors are configured to receive a sensing voltage via a sensing enable signal. The sense amplifier further includes a second pair of transistors that are serially connected between the first node and the second node. The second pair of transistors are configured to receive a pre-charge voltage. If the pre-charge voltage is a ground voltage, the first pair of transistors are PMOS transistors, and the second pair of transistors are NMOS transistors. Alternatively, if the pre-charge voltage is a power supply voltage, the first pair of transistors are NMOS transistors, the second pair of transistors are PMOS transistors, and the sensing voltage is a ground voltage. The sensing voltage may be one of a power supply voltage or an internal voltage of the semiconductor device.

According to at least some example embodiments, the semiconductor memory device further includes: an equalizer connected between the first node and the second node. The equalizer is configured to receive the pre-charge voltage. The equalizer includes a plurality of equalizing transistors configured to equalize and pre-charge the voltage between the first node and the second node to the pre-charge voltage if the word line is deactivated.

According to at least one other example embodiment, a semiconductor device comprises: a first bit line, a second bit line and a sense amplifier. The first bit line is connected to a plurality of memory cells in a first memory block. The second bit line is connected to a plurality of memory cells in a second memory block. The sense amplifier includes a first node and a second node. The first node is connected to the first and second bit line through a first isolation transistor and a second isolation transistor, respectively. The second node is not electrically connected to any bit line.

According to at least one other example embodiment, a semiconductor device comprises: a first bit line, a second bit line and a sense amplifier. The first bit line is connected to a plurality of memory cells in a first memory block. The second bit line is connected to a plurality of memory cells in a second memory block. The sense amplifier has a first node and a second node. The first node is connected to the first bit line through a first isolation transistor. The second node is connected to the second bit line through a second isolation transistor. The sense amplifier further includes: a first pair of transistors and a second pair of transistors between the first node and second node. A sensing voltage and a pre-charge voltage are applied to the first pair of transistors and the second pair of transistors, respectively.

At least one other example embodiment provides a method of sensing and amplifying in a semiconductor memory device. The semiconductor device includes a sense amplifier, which further includes a first node and a second node. The first node is connected to a bit line, whereas the second node is not electrically connected to any bit line. According to at least this example embodiment, a charge sharing operation is performed between the bit line and the first node, and a first data is sensed and amplified using a voltage difference between the first node and the second node. The voltage difference is caused by the charge sharing operation. A second data is sensed and amplified using a mismatch of a capacitive load between the first node and a second node.

BRIEF DESCRIPTION OF THE DRAWINGS

Example embodiments of inventive concepts will be more clearly understood from the following detailed description, taken in conjunction with the accompanying drawings in which.

DETAILED DESCRIPTION

Figure 1:
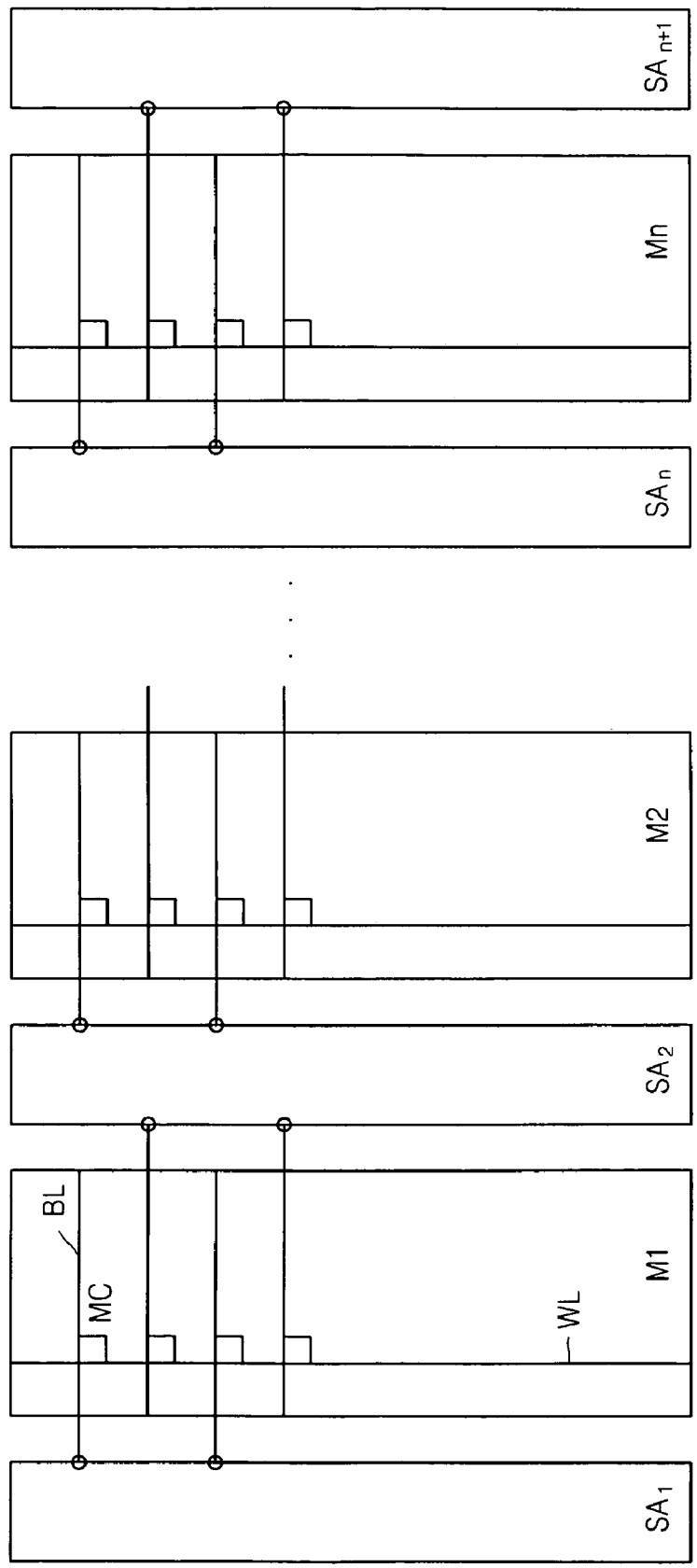
FIG. 1 shows a semiconductor memory device according to an example embodiment.

Detailed example embodiments are disclosed herein. However, specific structural and/or functional details disclosed herein are merely for the purpose of describing example embodiments. The claims may, however, be embodied in many alternate forms and should not be construed as limited to only the example embodiments set forth herein.

Example embodiments will now be described more fully with reference to the accompanying drawings. Example embodiments are provided so that this disclosure will be thorough, and will fully convey the scope to those who of ordinary skill in the art. In some example embodiments, well-known processes, well-known device structures, and well-known technologies are not described in detail to avoid unclear interpretation of the exemplary embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a semiconductor memory device according to an example embodiment.

Referring to FIG. 1, the semiconductor memory device 100 includes a plurality of memory blocks M1~Mn (where n is integer) and a plurality of sense amplifier areas $SA_1$~$SA_{n+1}$ (where n is integer). Each of the memory blocks includes a plurality of memory cells MC. Each memory cell MC is arranged at an intersection between a bit line BL and corresponding word line WL.

Each of the sense amplifier areas $SA_1$~$SA_{n+1}$ includes a plurality of sense amplifiers and a plurality of isolation transistors, which will be described in more detail later. Each of the isolation transistors is configured to determine whether to electrically connect a sense amplifier to a corresponding bit line BL in response to an isolation control signal.

As will be explained in more detail later, example embodiments do not use a bit line as a complimentary bit line when performing a sensing and amplifying operation. In addition, the edge memory blocks M1 and Mn do not include a dummy memory cell.

Figure 2:
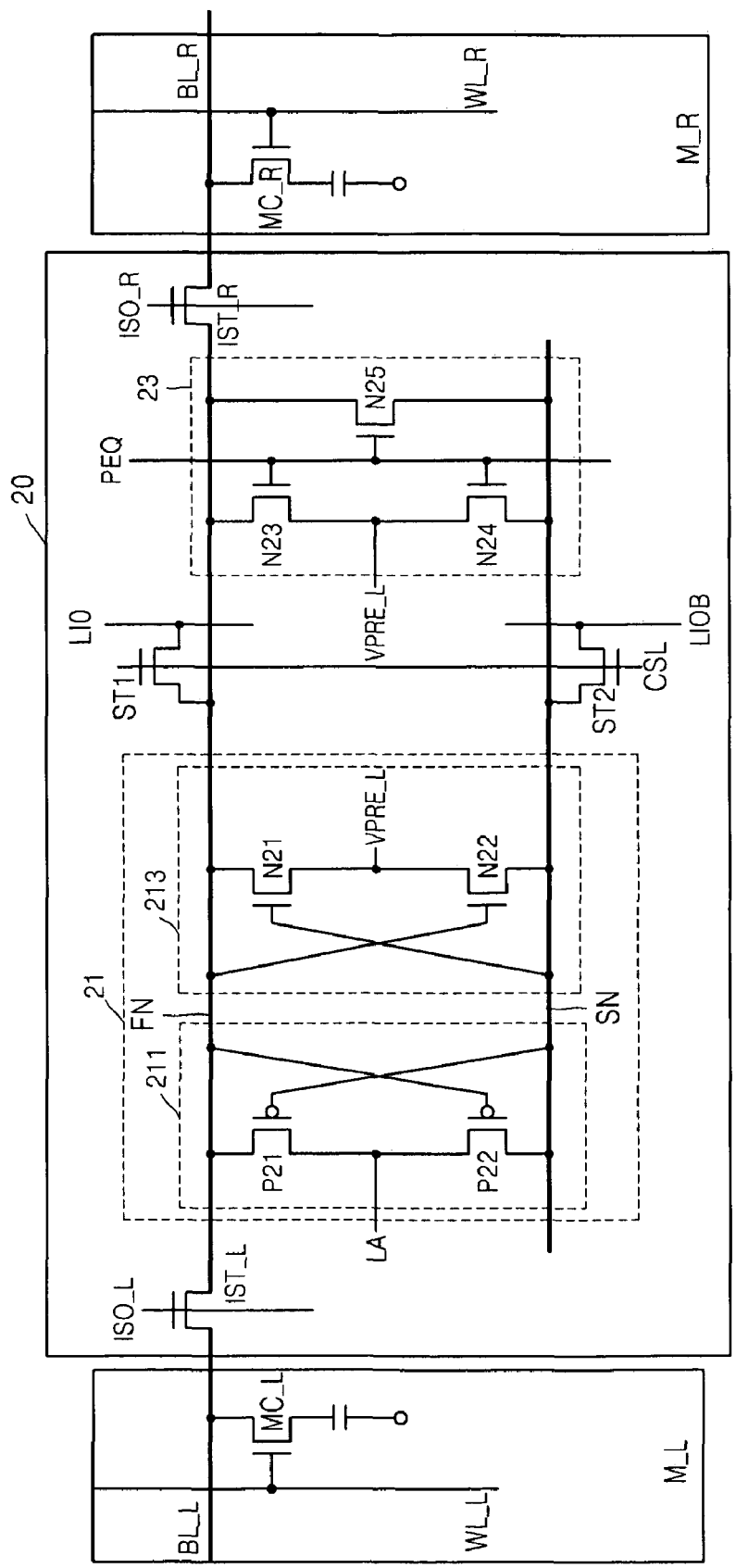
FIG. 2 shows a detailed circuit diagram of a sense amplifier area in accordance with an example embodiment.

FIG. 2 shows a detailed circuit diagram of a sense amplifier area according to an example embodiment. The sense amplifier area shown in FIG. 2 may serve as one or more of the sense amplifier areas shown in FIG. 1. Memory blocks M_L and M_R located at both sides of a sense amplifier area 20 in FIG. 2 are shown for convenience of explanation. In this example, L and R denote a left side and a right side, respectively, of the sense amplifier area 20.

Referring to FIG. 2, the sense amplifier area 20 includes a sense amplifier 21 and first and second isolation transistors IST_L and IST_R.

The sense amplifier 21 includes a first node FN, a second node SN, a first pair of transistors 211 and a second pair of transistors 213. The first pair of transistors 211 include PMOS transistors P21 and P22. The PMOS transistors P21 and P22 are connected serially between the first node FN and the second node SN. The PMOS transistors P21 and P22 are configured to receive a sensing voltage through a sensing enable signal LA. The sensing voltage may be a power supply voltage of the semiconductor memory device or an internal voltage generated in the semiconductor memory device using the power voltage.

The second pair of transistors 213 include NMOS transistors N21 and N22. The NMOS transistors N21 and N22 are also connected serially between the first node FN and the second node SN. But, the NMOS transistors N21 and N22 are configured to receive a pre-charging voltage VPRE_L. In one example, the pre-charging voltage VPRE_L is a ground voltage VSS.

The first isolation transistor IST_L is configured to determine whether to electrically connect the first node FN to a bit line BL_L in response to a first isolation signal ISO_L. The bit line BL_L is connected to at least one memory cell MC_L in the memory block M_L. The memory cell MC_L is also connected to a word line WL_L.

The second isolation transistor IST_R is configured to determine whether to connect the sense line to a bit line BL_R in response to a second isolation signal ISO_R. The bit line BL_R is connected to at least one memory cell MC_R in the memory block M_R. The memory cell MC_R is also connected to a word line WL_R.

The first node FN is selectively connected to the bit line BL_L or the bit line BL_R in response to isolation control signals, but the second node SN is not connected to any bit line. Therefore, the second node SN functions as a reference line during operation of the sense amplifier.

The isolation control signals ISO_L and ISO_R may have three types of voltage levels, one of which is greater than the power supply voltage or the internal voltage of the semiconductor memory device.

Still referring to FIG. 2, the sense amplifier area 20 further includes an equalizer 23 arranged between the first node FN and the second node SN. The equalizer 23 includes a plurality of transistors N23, N24 and N25. In this example, the plurality of transistors N23, N24 and N25 are NMOS transistors. The transistors N23 and N24 are configured to receive the pre-charge voltage VPRE_L. Each of the transistors N23, N24 and N25 is configured to receive an equalizing control signal PEQ. The equalizer 23 is configured to equalize the voltage of the first node FN and the second node SN to have the pre-charge voltage VPRE_L in response to the equalizing control signal PEQ. The pre-charge voltage VPRE_L of the equalizer 23 may be different from the pre-charge voltage of the second pair of transistors 213.

Still referring to FIG. 2, the sense amplifier area 20 further includes a plurality of column selection transistors ST1 and ST2. A first column selection transistor ST1 selectively connects a data line LIO to the first node FN in response to a column selection signal CSL. A second column selection transistor ST2 selectively connects a data line LIOB to the second node SN in response to the column selection signal CSL.

Figure 3:
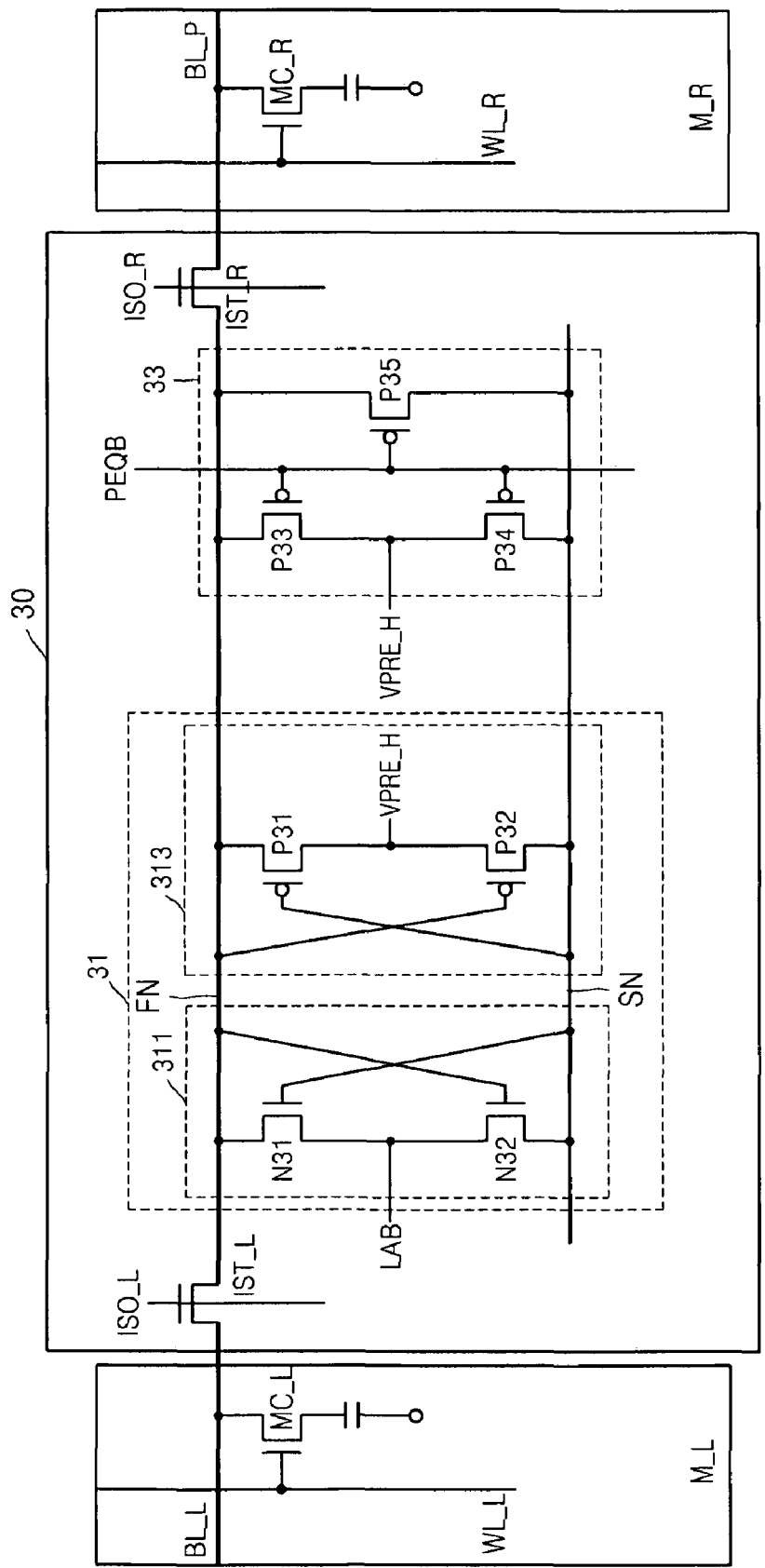
FIG. 3 shows a detailed circuit diagram of a sense amplifier area in accordance with another example embodiment.

FIG. 3 shows a detailed circuit diagram of a sense amplifier area according to another example embodiment. The sense amplifier area 30 shown in FIG. 3 may serve as one or more of the sense amplifier areas shown in FIG. 1. In FIG. 3, memory blocks M_L and M_R located at both sides of the sense amplifier area 30 are shown together in FIG. 3 for convenience of explanation.

Referring to FIG. 3, in comparison with FIG. 2, the sense amplifier area 30 has the same or substantially the same construction, except for the following.

In the sense amplifier 31, a first pair of transistors 311 includes NMOS transistors N31 and N32, and a second pair of transistors 313 includes PMOS transistors P31 and P32. The first pair of transistors 311 are configured to receive a sensing voltage through a sensing enable signal LAB. The sensing voltage may be a ground voltage VSS. The second pair of transistors 313 are configured to receive a pre-charging voltage VPRE_H. The pre-charging voltage VPRE_H may be a power supply voltage of the semiconductor memory device or an internal voltage generated in the semiconductor memory device.

The sense amplifier area 30 further includes an equalizer 33. The equalizer 33 includes a plurality of PMOS transistors P33, P34 and P35. The PMOS transistors P33 and P34 are configured to receive the pre-charging voltage VPRE_H. The equalizer 33 is configured to equalize the voltage of the first node FN and the second node SN to have the pre-charge voltage VPRE_H in response to an equalizing control signal PEQB. In an alternative example embodiment, the equalizer 33 may include NMOS transistors similar or substantially similar to the equalizer 23 shown in FIG. 2. In this case, the equalizer 33 is configured to equalize the voltage of the first node FN and the second node SN to have the pre-charge voltage VPRE_H in response to an equalizing control signal PEQ.

The sense amplifier 31 in FIG. 3 uses a power supply pre-charge scheme, rather than the ground pre-charge scheme of the sense amplifier 21 in FIG. 2.

Figure 4:
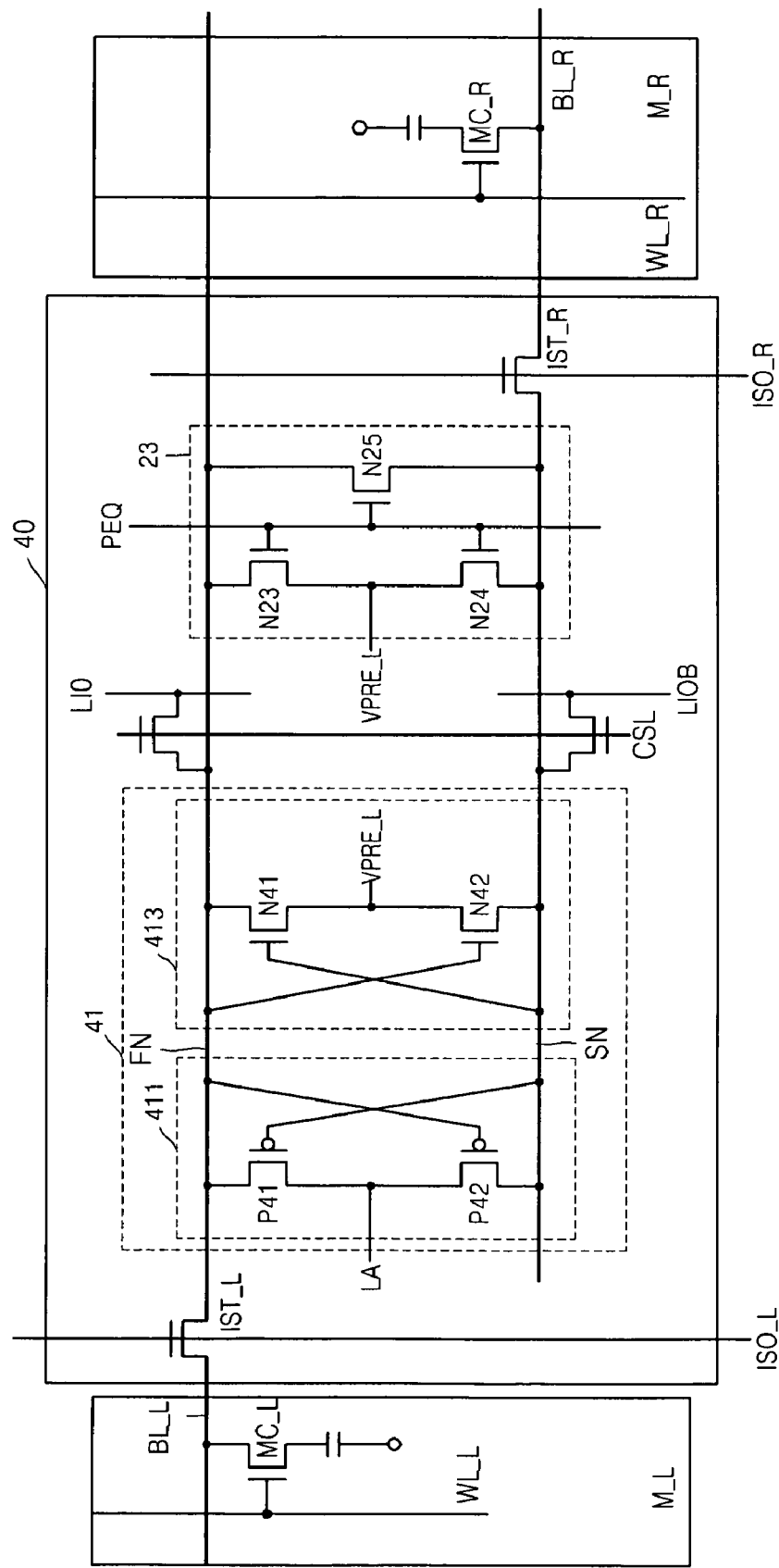
FIG. 4 shows a detailed circuit diagram of a sense amplifier area according to yet another example embodiment.

FIG. 4 shows a detailed circuit diagram of a sense amplifier area according to yet another example embodiment. The sense amplifier area shown in FIG. 4 may serve as one or more of the sense amplifier areas shown in FIG. 1. The memory blocks M_L and M_R located at both sides of a sense amplifier area 40 are shown together in FIG. 4 for convenience of explanation.

Referring to FIG. 4, in comparison with FIG. 2, a sense amplifier area 40 has the same or substantially the same construction except for the following. The sense amplifier 41 in FIG. 4 uses a ground pre-charge scheme similar or substantially similar to the sense amplifier 21 in FIG. 2.

According to at least the example embodiment shown in FIG. 4, the sense amplifier 41 includes a first node FN, a second node SN, a first pair of transistors 411 and a second pair of transistors 413. The first node FN is connected to a bit line BL_L through a first isolation transistor IST_L. The second node SN is connected to a bit line BL_R through a second isolation transistor IST_R. In FIG. 4, the second node SN is selectively connected to the bit line BL_R via the isolation transistor IST_R in response to a second isolation signal ISO_R. The first node FN is configured to supply a reference voltage to the sense amplifier 41 when a memory cell in the second memory block M_R is selected. The second node SN is also configured to supply a reference voltage to the sense amplifier 41 when a memory cell in the first memory block M_R is selected.

Figure 5:
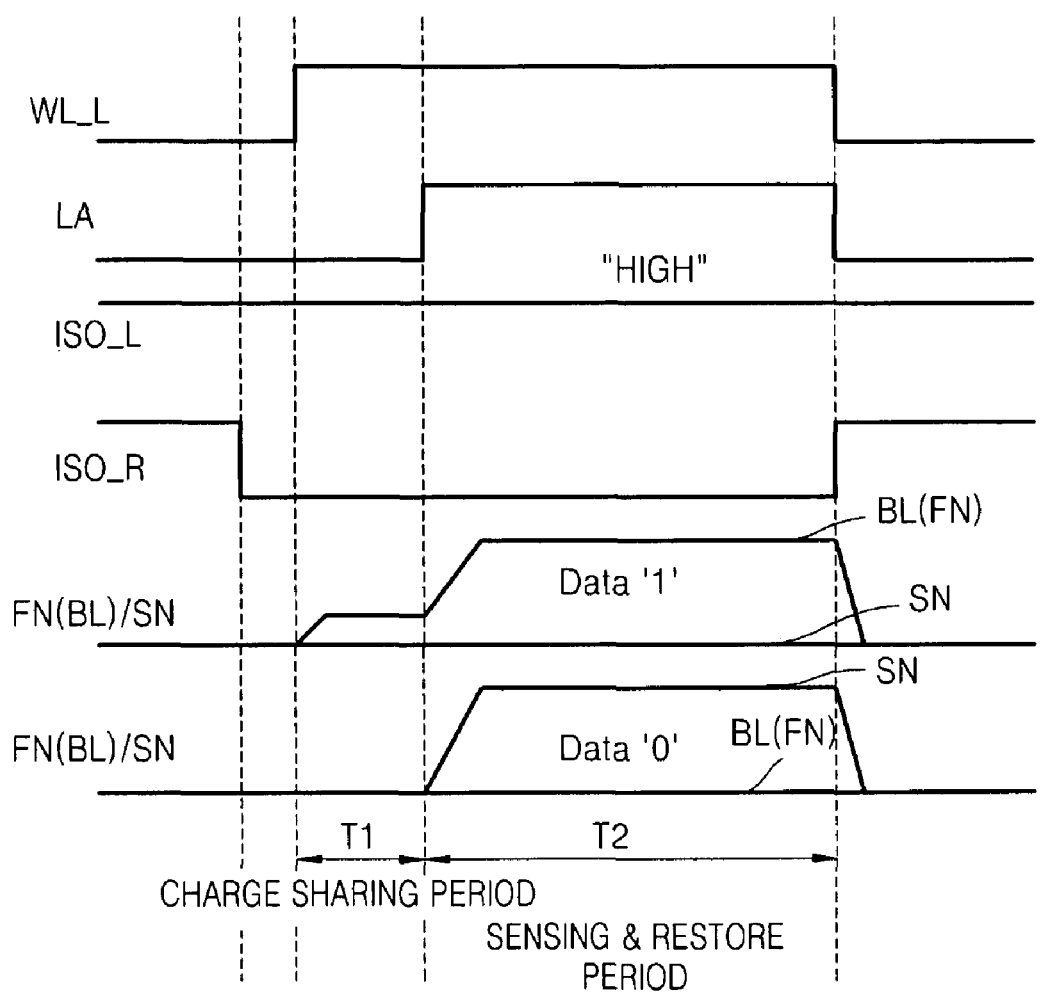
FIG. 5 shows an example timing diagram of a sense amplifier adopting ground pre-charging method according to an example embodiment.

FIG. 5 is an example timing diagram showing an operation of a sense amplifier adopting a ground pre-charge scheme according to an example embodiment. The ground pre-charge scheme is used in the sense amplifiers of FIG. 2 and FIG. 4. Thus, an example operation of a sense amplifier using the ground pre-charge scheme will be explained with reference to FIGS. 2, 4, and 5.

In the stand-by state, all bit lines, the first node FN and the second node SN of the sense amplifier are pre-charged to a pre-charge voltage VSS. The isolation transistors ISO_L and IST_R turn on in response to a high voltage of the isolation control signal ISO_L and ISO_R, respectively. The first node FN of the sense amplifier 21 in FIG. 2 is connected to the first bit line BL_L. However, in FIG. 4 the first node FN and the second node SN of the sense amplifier 21 are connected to the first bit line BL_L and the second bit line BL_R, respectively.

The first node FN, the second node SN and the bit lines BL_L and BL_R are pre-charged to have the pre-charge voltage VPRE_H, similar to the ground voltage VSS, by the equalizer 23. The equalizer 23 performs an equalizing operation in response to a high voltage of the equalizing control signal PEQ. The high voltages of the isolation control signals and the equalizing control signal may be the same as, substantially the same as or different from each other.

After receiving an active command for a word line WL_L at the left side of the sense amplifier area 20 or 40 from a memory controller, the isolation control signal ISO_L maintains a high voltage or increases to a higher voltage so that the first node FN maintains a connection with the first bit line BL_L, and the isolation control signal ISO_R falls to the ground voltage so that the first node FN in FIG. 2 disconnects from the second bit line BL_R and the second node SN in FIG. 4 disconnects from the second bit line BL_R.

The word line is then activated to an activating voltage so that the memory cell connects to the first bit line BL_L. A charge sharing operation is performed between the memory cell, the first bit line BL_L and the first node FN after activating the word line WL_L during a charge sharing period T1.

If data "1" is stored in the memory cell MC_L, the first bit line BL_L and the first node FN have the same or substantially the same voltage level, which is greater than the pre-charge voltage level VSS, as a result of the charge sharing operation. The second node SN maintains the pre-charge voltage level VSS.

If data "0" is stored in the memory cell MC_L, the first bit line BL_L, the first node FN and the second node SN maintain the pre-charge voltage level VSS.

After the charge sharing period T1, the sensing enable signal LA is enabled to have the sensing voltage so that a sensing and amplifying operation begins.

For sensing and amplifying of data "1", the sense amplifier senses a voltage difference between the first node FN and the second node SN, and amplifies the voltage difference so that the first node FN and the first bit line BL_L have the sensing voltage, whereas the second node SN maintains the pre-charge voltage VSS.

For sensing and amplifying of data "0", as the sensing enable signal LA is enabled to have the sensing voltage, the voltage of the second node SN increases faster than the voltage of the first node FN because the second node SN has a smaller capacitive load than the sum of the first bit line BL_L and the first node FN. As the voltage of the second node SN reaches the threshold voltage of the transistor N21 in FIG. 2 or N41 in FIG. 4, the transistor N21 or N41 turns on and the first node FN and the first bit line BL_L connect to ground. Thus, transistor P22 or P42 in the first pair of transistors in the sense amplifier 21 or 41 turn on and transistor P21 or P41 turn off. Therefore, the second node SN rises to the sensing voltage and the first node FN and the bit line BL_L remains at the pre-charge voltage VSS.

In this example, sensing and amplifying of data "1" uses a voltage difference caused by a charge sharing operation, whereas sensing and amplifying of data "0" does not use the charge sharing operation. Rather, sensing and amplifying of data "0" uses a mismatch of a capacitive load between the first node connected to the bit line and the second node in the sense amplifier. Thus, there is no need to have any complementary bit line on a memory block.

The sensing enable signal LA is kept activated during a sensing and restore period T2 to restore data in the memory cell MC_L.

Figure 6:
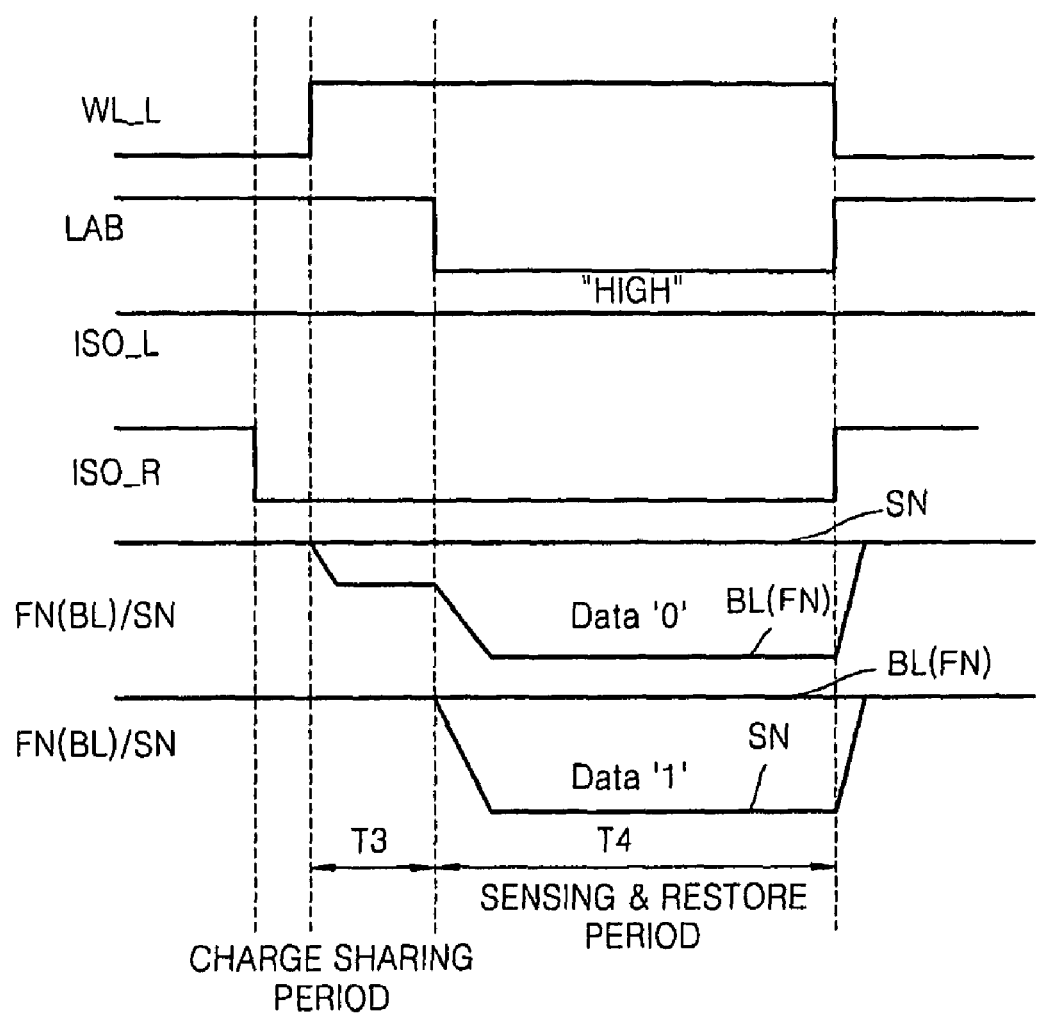
FIG. 6 shows an example timing diagram of a sense amplifier adopting VDD pre-charging method according to an example embodiment.

FIG. 6 shows an example timing diagram for a sense amplifier adopting the VDD pre-charge method of FIG. 3. Hereinafter, example operation of a sense amplifier using the VDD pre-charge scheme will be explained with reference to FIG. 3 and FIG. 6.

In the stand-by state, all bit lines, the first node FN and the second node SN of the sense amplifier are pre-charged to the pre-charge voltage VDD. The first and second isolation transistors IST_L and IST_R turn on in response to a high voltage of the isolation control signals ISO_L and ISO_R, respectively. The first node FN of the sense amplifier 31 is connected to the first bit line BL_L. The first node FN, the second node SN and the bit lines are pre-charged to the pre-charge voltage VDD by the equalizer 33 performing an equalizing operation in response to a low voltage of the equalizing control signal PEQB.

After receiving an active command for the word line WL_L at the left side of the sense amplifier area 30 from a memory controller, the isolation control signal ISO_L maintains the high voltage or increases to a higher voltage so that the first node FN maintains connection with the first bit line BL_L, and the isolation control signal ISO_R falls to the ground voltage so that the first node FN disconnects from the second bit line BL_R. The word line WL_L is then activated to an activating voltage so that the memory cell MC_L is connected to the first bit line BL_L.

During a charge sharing period T3, a charge sharing operation is performed between the memory cell MC_L, the first bit line BL_L and the first node FN after activating the word line WL_L.

If data "0" is stored in the memory cell MC_L, the first bit line BL_L and the first node FN have the same or substantially the same voltage level, which is lower than the pre-charge voltage level VDD as a result of the charge sharing operation. The second node SN maintains the pre-charge voltage level VDD. If data "1" is stored in the memory cell MC_L, the first bit line BL_L, the first node FN and the second node SN maintain the pre-charge voltage level VDD.

After the charge sharing period T3, the sensing enable signal LAB is enabled to have the sensing voltage VSS, and thus, a sensing and amplifying operation begins.

For sensing and amplifying of data "0", the sense amplifier senses a voltage difference between the first node FN and the second node SN, and amplifies the voltage difference so that the first node FN and the first bit line BL_L have the sensing voltage VSS and the second node SN maintains the pre-charge voltage VDD.

For sensing and amplifying of data "1", as the sensing enable signal LAB is enabled to have the sensing voltage, the voltage of the second node SN decreases faster than the voltage of the first node FN because the second node SN has a smaller capacitive load than that of the sum of the first bit line BL_L and the first node FN. As the voltage of the second node SN reaches the threshold voltage of the transistor P31 of the second pair of transistors, the transistor P31 turns on and then the first node FN and the first bit line BL_L are connected to the pre-charge voltage VDD. Thus, the transistor N32 in the first pair of transistors in the sense amplifier 31 turns on and the transistor N31 turns off. Therefore, the second node SN decreases to the sensing voltage VSS and the first node FN and the bit line BL_L remain at the pre-charge voltage VDD.

In this example, sensing and amplifying of data "0" uses the voltage difference caused by a charge sharing operation and sensing and amplifying of data "1" does not use the charge sharing operation. Rather, the sensing and amplifying of data "1" uses a mismatch of capacitive load between the first node connected to the bit line and the second node in the sense amplifier. Thus, there is no need to have any complementary bit line on a memory block.

The sensing enable signal LAB is kept active during a sensing and restore period T4 to restore data in the memory cell MC_L.

According to example embodiments discussed herein, semiconductor memory devices have bit lines on each memory block without a complementary bit line. In addition, semiconductor memory devices may have better cell efficiency because the edge memory blocks do not have any dummy cells. Because a sense amplifier of the semiconductor memory devices use either the VDD pre-charge scheme or VSS pre-charge scheme, power consumption may also be reduced.

Figure 7:
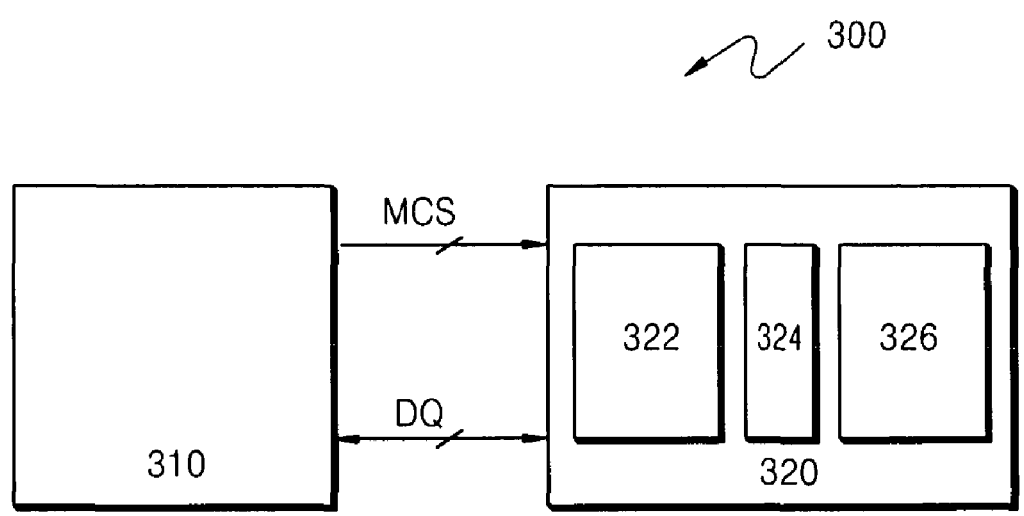
FIG. 7 shows a memory system having a semiconductor memory device according to an example embodiment.

FIG. 7 shows a memory system having a semiconductor memory device according to an example embodiment.

The memory system 300 includes a memory controller 310 and a semiconductor device 320. The memory controller 310 is configured to send control signals MCS through a first bus to the semiconductor memory device 320. The control signals MCS include information of an active row command. The memory controller 310 is further configured to interface a data signal DQ to/from the semiconductor memory device 320 through a second bus. The second bus may be unidirectional or bidirectional.

The semiconductor memory device 320 includes memory blocks 322 and 326 and a sense amplifier area 324. The sense amplifier area 324 may be the same or substantially the same as that shown in FIG. 2, 3 or 4. The semiconductor memory device 320 is configured to perform read functions and/or write functions in response to the control signals MCS. For a higher density memory system, the semiconductor device 320 may be substituted by a memory module on which many semiconductor devices similar or substantially to device 320 are mounted.

Figure 8:
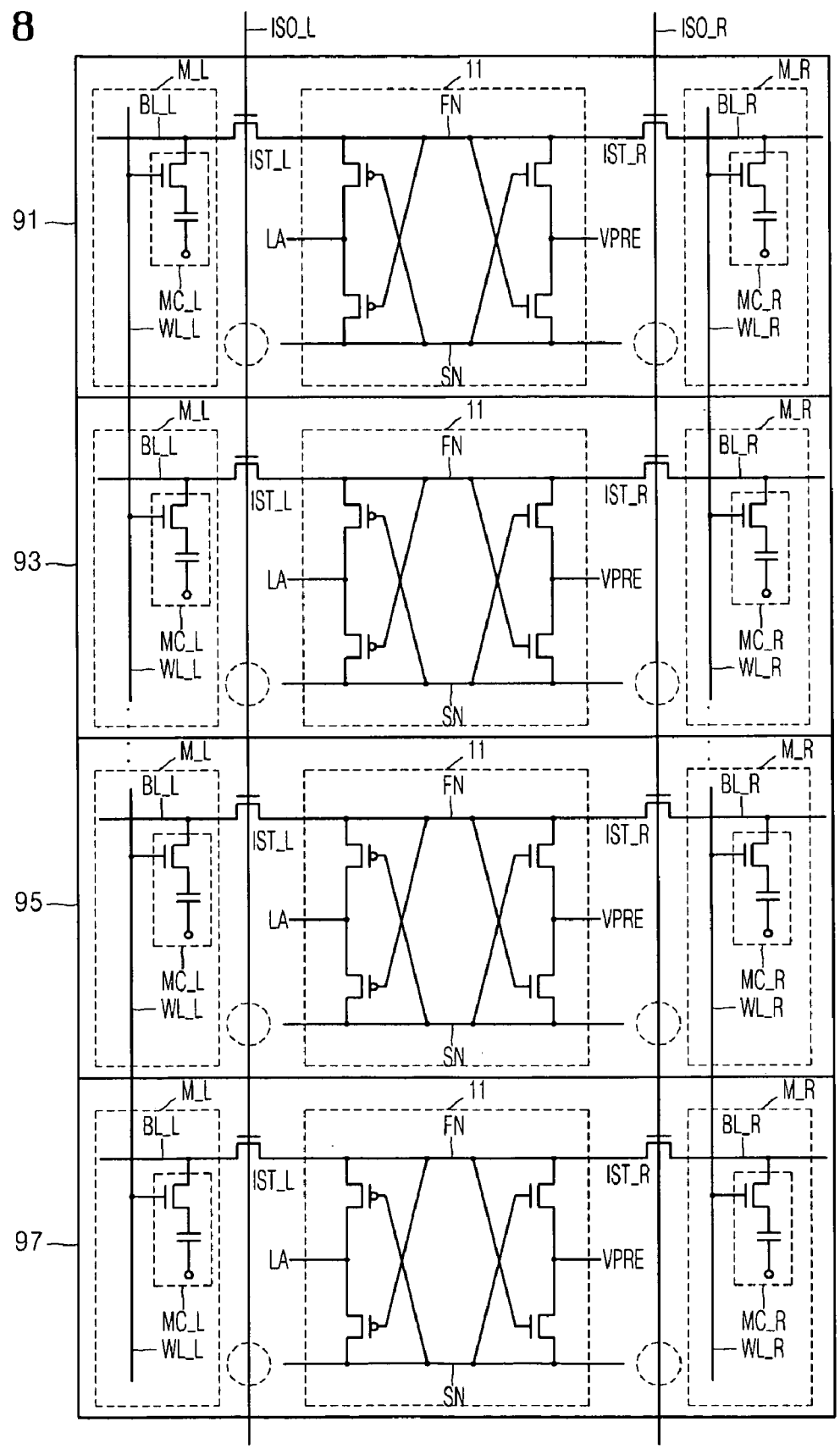
FIG. 8 shows a semiconductor memory system according to another example embodiment.

FIG. 8 shows a semiconductor memory system according to an example embodiment.

Referring to FIG. 8, the semiconductor memory system includes a plurality of semiconductor memory devices 91, 93, 95 and 97. For the sake of clarity, semiconductor memory device 91 will be described in detail. However, each of the semiconductor memory devices 93, 95 and 97 may include the same or substantially the same elements and may operate in the same or substantially the same manner.

Referring to the semiconductor memory device 91 in FIG. 8, a sense amplifier area includes a sense amplifier 11. The sense amplifier 11 includes a first node FN, a second node SN, a first pair of transistors (shown at the left side of the sense amplifier 11) and a second pair of transistors (shown at a right side of the sense amplifier 11). The first pair of transistors includes two PMOS transistors connected serially between the first node FN and the second node SN. The PMOS transistors are configured to receive a sensing voltage through a sensing enable signal LA. In one example, the sensing voltage may be a power supply voltage of the semiconductor memory device(s) or an internal voltage generated in the semiconductor memory device using the power voltage.

The second pair of transistors includes two NMOS transistors connected serially between the first node FN and the second node SN. The NMOS transistors are configured to receive a pre-charging voltage VPRE. The pre-charging voltage VPRE may be one of a supply voltage VDD and a ground voltage VSS.

The semiconductor memory system 19 further includes first and second isolation transistors IST_L and IST_R. The first isolation transistor IST_L is configured to determine whether to electrically connect the first node FN to a bit line BL_L in response to a first isolation signal ISO_L. The bit line BL_L is connected to at least one memory cell MC_L in the memory block M_L. The memory cell MC_L is also connected to a word line WL_L.

The second isolation transistor IST_R is configured to determine whether to connect the sense line to a bit line BL_R in response to a second isolation signal ISO_R. The bit line BL_R is connected to at least one memory cell MC_R in the memory block M_R. The memory cell MC_R is also connected to a word line WL_R.

The first node FN is selectively connected to the bit line BL_L or the bit line BL_R in response to isolation control signals ISO_R and ISO_L, but the second node SN is not connected to any bit line. Therefore, the second node SN functions as a reference line during operation of the sense amplifier.

The sense amplifier shown in FIG. 8 does not include an equalizer arranged between the first node FN and the second node SN. Although the equalizer is not shown in FIG. 8, semiconductor memory systems according to example embodiments may include a plurality of semiconductor memory devices, wherein one or more of the semiconductor memory devices includes an equalizer arranged between the first node FN and the second node SN. For example, one or more of the semiconductor memory devices 91, 93, 95 and 97 in FIG. 8 may be configured as shown in FIGS. 2, 3, and/or 4.

Still referring to FIG. 8, although a plurality of column selection transistors are not shown in FIG. 8, semiconductor memory systems according to example embodiments may include a plurality of semiconductor memory devices, wherein one or more of the semiconductor memory devices includes a plurality of column selection transistors. For example, as mentioned above, one or more of the semiconductor memory devices 91, 93, 95 and 97 in FIG. 8 may be configured as shown in FIGS. 2, 3, and/or 4.

Although the semiconductor memory system shown in FIG. 8 includes four semiconductor memory devices, semiconductor memory systems according to example embodiments may include any number of semiconductor memory devices.

While inventive concepts of example embodiments have been particularly shown and described with reference to the example embodiments shown in the drawings, it will be understood that various changes in form and details may be made therein without departing from the spirit and scope of the following claims.

What is claimed is:
1. A semiconductor device comprising:
 a bit line connected to a plurality of memory cells in a memory block; and
 a sense amplifier having a first node connected to the bit line and a second node not connected to any bit line, the second node having a capacitive load less than that of the bit line, wherein
   the first node and the second node are pre-charged to a ground voltage or a supply voltage, and
   the second node is not connected to any cell.

2. The semiconductor device of claim 1, wherein the capacitive load of the bit line is about 10 times greater than that of the second node.

3. The semiconductor device of claim 2, further comprising:
an isolation transistor connected between the bit line and the first node.

4. The semiconductor device of claim 3, further comprising:
a word line connected to at least one of the plurality of memory cells; and wherein
the isolation transistor connects the first node to the bit line if the word line is activated.

5. The semiconductor device of claim 4, wherein the sense amplifier is configured to sense and amplify a voltage difference caused by a charge sharing operation between the first node and the second node based on data of one of the plurality of memory cells.

6. The semiconductor device of claim 4, wherein the sense amplifier is configured to sense and amplify a voltage difference caused by a mismatch in a capacitive load between the first node and the second node based upon data of one of the plurality of memory cells.

7. The semiconductor device of claim 3, wherein the sense amplifier comprises:
a first pair of transistors serially connected between the first node and the second node, the first pair of transistors being configured to receive a sensing voltage through a sensing enable signal; and
a second pair of transistors serially connected between the first node and the second node, the second pair of transistors being configured to receive a pre-charge voltage.

8. The semiconductor device of claim 7, wherein if the pre-charge voltage is a ground voltage, the first pair of transistors are PMOS transistors and the second pair of transistors are NMOS transistors.

9. The semiconductor device of claim 8, wherein the sensing voltage is one of a power supply voltage or an internal voltage of the semiconductor device.

10. The semiconductor device of claim 7, wherein the first pair of transistors are NMOS transistors and the second pair of transistors are PMOS transistors if the pre-charge voltage is a power supply voltage.

11. The semiconductor device of claim 10, wherein the sensing voltage is a ground voltage.

12. The semiconductor device of claim 7, wherein the semiconductor device further comprises:
an equalizer connected between the first node and the second node, and configured to receive the pre-charge voltage.

13. The semiconductor device of claim 7, wherein equalizing transistors are configured to equalize and pre-charge the voltage between the first node and the second node to the pre-charge voltage if the word line is deactivated.

14. A semiconductor device comprising:
a first bit line connected to a plurality of memory cells in a first memory block;
a second bit line connected to a plurality of memory cells in a second memory block; and
a sense amplifier having a first node and a second node, the first node being connected to the first bit line through a first isolation transistor, and being connected to the second bit line through a second isolation transistor; wherein
the second node is not connected to any bit line,
the first node and the second node are pre-charged to a ground voltage or a supply voltage, and
the second node is not connected to any cell.

15. A method of sensing and amplifying for a semiconductor memory device having a sense amplifier including a first node connected to a bit line and a second node not connected to any bit line or any cell, the method comprising;
pre-charging the first and second nodes to a supply voltage or a ground voltage;
performing a charge sharing operation between the bit line and the first node;
sensing and amplifying a first data using a voltage difference between the first node and the second node, which is caused by the charge sharing operation; and
sensing and amplifying a second data using a mismatch of a capacitive load between the first node and a second node.

16. A semiconductor device comprising:
a first bit line connected to a plurality of memory cells in a first memory block;
a second bit line connected to a plurality of memory cells in a second memory block; and
a sense amplifier having a first node and a second node, the first node being connected to the first bit line through a first isolation transistor, and the second node being connected to the second bit line through a second isolation transistor; wherein
the sense amplifier includes,
a first pair of transistors and a second pair of transistors connected between the first node and second node, the first pair of transistors being configured to receive a sensing voltage and the second pair of transistors being configured to receive a pre-charge voltage,
when data of a memory cell in the first memory block is sensed and amplified by the sense amplifier, the second isolation transistor is turned off such that the second node is not connected to any bit line, and
when data of a memory cell in the second memory block is sensed and amplified by the sense amplifier, the first isolation transistor is turned off such that the first node is not connected to any bit line.

17. A memory system comprising:
a memory controller configured to generate and output control signals; and
the semiconductor memory device of claim 1 configured to perform at least one of read and write functions in response to the control signals from the memory controller.

18. A memory system comprising:
a memory controller configured to generate and output control signals; and
the semiconductor device of claim 14 configured to perform at least one of read and write functions in response to the control signals from the memory controller.

19. A memory system comprising:
a memory controller configured to generate and output control signals; and
the semiconductor device of claim 16 configured to perform at least one of read and write functions in response to the control signals from the memory controller.

* * * * *